(12) United States Patent
Jacques et al.

(10) Patent No.: US 12,520,418 B2
(45) Date of Patent: Jan. 6, 2026

(54) HIGH-SPEED OPTICAL PACKAGE WITH CONTINUOUS RADIO FREQUENCY (RF) FLEXIBLE PRINTED CIRCUIT

(71) Applicant: CIENA CORPORATION, Hanover, MD (US)

(72) Inventors: Maxime Jacques, Montreal (CA); Michael Vitic, Chelsea (CA); Jean-Frédéric Gagné, Québec (CA); Simon Paradis, Québec (CA)

(73) Assignee: CIENA CORPORATION, Hanover, MD (US)

( * ) Notice: Subject to any disclaimer, the term of this patent is extended or adjusted under 35 U.S.C. 154(b) by 301 days.

(21) Appl. No.: 18/337,572

(22) Filed: Jun. 20, 2023

(65) Prior Publication Data

US 2024/0431022 A1 Dec. 26, 2024

(51) Int. Cl.
*H05K 1/02* (2006.01)
*G02B 6/42* (2006.01)
*H05K 1/18* (2006.01)
*H05K 3/00* (2006.01)

(52) U.S. Cl.
CPC ......... *H05K 1/0281* (2013.01); *H05K 1/0218* (2013.01); *H05K 1/0237* (2013.01)

(58) Field of Classification Search
CPC .... G02B 6/4281; H05K 1/0237; H05K 1/189; H05K 1/0274; H05K 1/0281; H05K 1/0218; H05K 1/025; H05K 2201/10121; H05K 2201/10674; H05K 3/0058
See application file for complete search history.

(56) References Cited

U.S. PATENT DOCUMENTS

| | | | |
|---|---|---|---|
| 2014/0212086 A1* | 7/2014 | Sunaga ................. | G02B 6/428 385/14 |
| 2014/0308047 A1* | 10/2014 | Mak ...................... | G02F 1/0123 359/279 |
| 2017/0062688 A1* | 3/2017 | Zhu ......................... | H05K 1/00 |
| 2022/0003948 A1* | 1/2022 | Zhou ...................... | G02F 1/212 |
| 2022/0400548 A1* | 12/2022 | Gupta ................... | G01S 7/4816 |

OTHER PUBLICATIONS

"International Search Report & Written Opinion for PCT/US2024/032820", Oct. 1, 2024, 11 Pages.

* cited by examiner

*Primary Examiner* — Timothy J Thompson
*Assistant Examiner* — Amol H Patel
(74) *Attorney, Agent, or Firm* — Guntin & Gust, PLC; Kenneth S. Kwan

(57) ABSTRACT

Aspects of the subject disclosure may include, for example, a flexible printed circuit (FPC) for interconnecting an optical device and an application specific integrated circuit (ASIC), wherein the FPC includes a first section that is configured with a first plurality of electrically conductive traces and a second section over which one or more components are disposed, and wherein the second section is configured with a second plurality of electrically conductive traces that extend from the first plurality of electrically conductive traces to the one or more components. Other embodiments are disclosed.

20 Claims, 8 Drawing Sheets

# HIGH-SPEED OPTICAL PACKAGE WITH CONTINUOUS RADIO FREQUENCY (RF) FLEXIBLE PRINTED CIRCUIT

FIELD OF THE DISCLOSURE

The subject disclosure relates to a continuous radio frequency (RF) flexible printed circuit for high-speed optical packages.

BACKGROUND

Current "state of the art" implementations of transmitter (Tx) radio frequency (RF) signal paths (e.g., between a Tx application specific integrated circuit (ASIC) and a coherent driver modulator (CDM) transmitter optical package) pass through several soldered junctions.

BRIEF DESCRIPTION OF THE DRAWINGS

Reference will now be made to the accompanying drawings, which are not necessarily drawn to scale, and wherein.

DETAILED DESCRIPTION

Figure 1A:
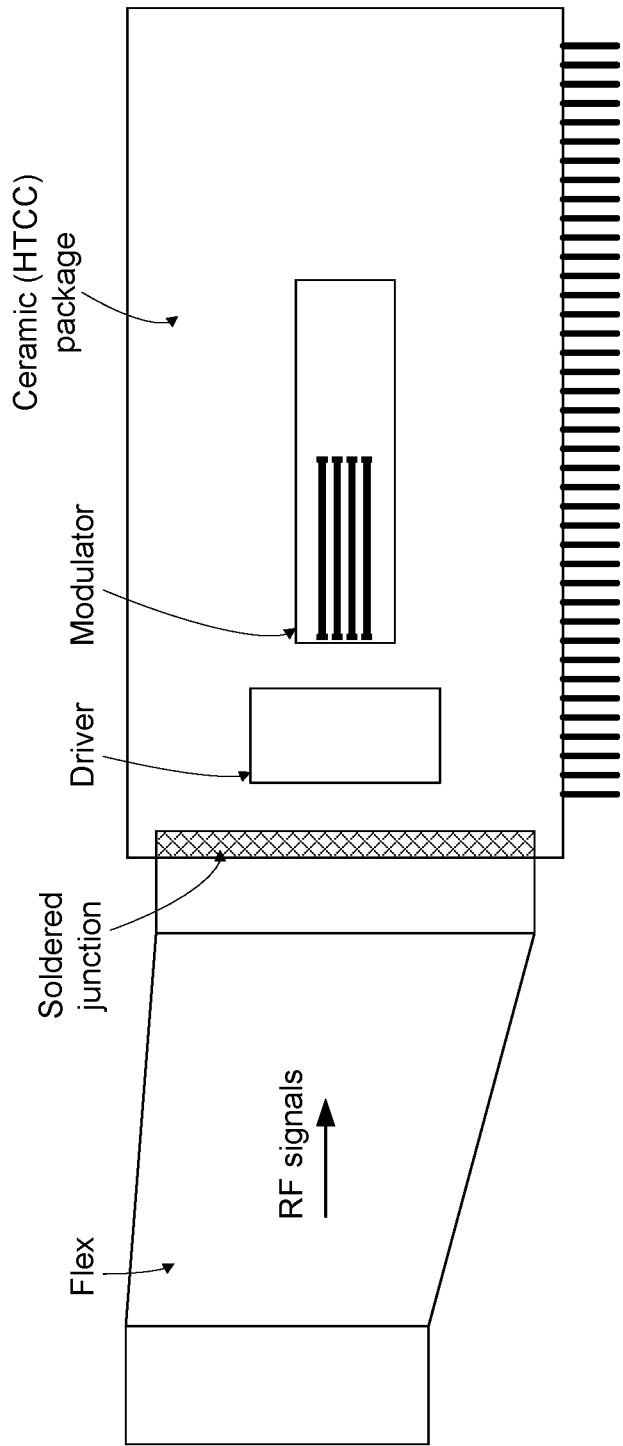
FIG. 1A illustrates an example attachment of a Flex to a (e.g., Indium Phosphide (InP)) CDM high-temperature co-fired ceramic (HTCC) package via soldered junctions.

Because soldered junctions are generally subject to tolerances and misalignments, proper soldering of a flexible printed circuit (FPC)—also referred to as a Flex-PCB (or simply Flex)—requires accurate solder positioning, precise solder amounts, and uniform solder thicknesses. Even slight inaccuracies/non-uniformities in solder application can drastically impact high frequency operations. Further, negative effects from solder-related discontinuities are more magnified at higher operating frequencies (e.g., 100 gigahertz (GHz) or higher). FIG. 1A illustrates an example, conventional attachment of a Flex to an InP CDM HTCC package via soldered junctions. Here, the HTCC acts as an RF feedthrough, and there may be two wire bond interfaces (i.e., between the HTCC and the driver and between the driver and the modulator/modulator carrier). In other conventional implementations, such as in a case where a flip-chip driver is involved, the Flex-PCB may be soldered directly onto the CDM's internal RF carrier. In these implementations, there may be a wire bond interface (i.e., between the RF carrier and the modulator). In short, conventional implementations of RF signal paths from a Tx ASIC to a CDM transmitter optical package come with RF transitions that yield undesired RF penalties.

The subject disclosure describes illustrative embodiments of an "extended" FPC for an optical package that reduces or eliminates the need for solder-based/wire bond-based RF transitions in RF signal paths. In various embodiments, the FPC may be configured to interconnect devices in an electro-optic (EO) transmitter, such as a Tx ASIC and a CDM. In one or more embodiments, the FPC may be configured to interconnect devices in an opto-electric receiver, such as an Rx ASIC and an integrated coherent receiver (ICR) or micro-ICR (μICR). Embodiments of the FPC may be agnostic to form factor or modulation scheme. Thus, the FPC may be utilized in transceiver applications, intensity modulation/direct detection (IM/DD) applications (e.g., on-board optics (OBO), co-packaged optics (CPO), etc.), and/or other applications. In exemplary embodiments, the FPC may include a flexible section and a rigid section. In the case of an EO transmitter, for example, the flexible section of the FPC may serve as a high-speed interconnect (or RF carrier) between the output of the Tx ASIC (e.g., digital to analog converts (DACs)) and the CDM input, and the rigid section of the FPC may serve as an RF interconnect to an optical modulator (e.g., a nested Mach-Zehnder (MZ) modulator). Here, the Flex may extend all the way to the high-speed modulator interface within the EO module. In addition to functioning as a high-speed interconnect, the FPC may, in some embodiments, also function as an RF feedthrough of the CDM package—that is, the extended FPC may be a continuous RF carrier that traverses the RF input side of the CDM package. In certain embodiments, the FPC may (e.g., optionally) include, or serve as an RF carrier substrate for, one or more flip-chip active devices (e.g., a flip-chip driver) and/or surface mount (SMT) passive devices, such as direct current (DC)—blocking capacitors and so on. In exemplary embodiments, the rigid section of the FPC may include, or be supported by, a stiffener material that functions as the RF carrier substrate. In various embodiments, the stiffener may be coupled (e.g., attached) to the CDM package—i.e., an underside thereof—via a (e.g., soft) epoxy or other suitable material.

Conventional implementations require the assembly step of soldering the Flex onto a substrate, which comes with yield/reliability/cost implications. RF transitions through a low conductivity material, such as solder, have imperfections that induce losses, which negatively impacts the overall Tx RF budget (i.e., signal-to-noise ratio (SNR)). Exemplary embodiments of the FPC advantageously eliminate the need for soldering and thus eliminate soldered junctions at the Flex-PCB and CDM package interface. This reduces reliability risks and the overall complexity of the CDM assembly process. As compared to the conventional implementation shown in FIG. 1A, use of the exemplary FPC, described herein, allows for one fewer soldered junction (at the Flex-CDM interface). As compared to existing InP-based CDM configurations, use of the exemplary FPC allows for two fewer RF interfaces—i.e., one fewer soldered junction and one fewer wire bond interface. Having continuous metallic traces from the flexible section of the Flex to the rigid section of the Flex, as described herein, significantly reduces RF losses in the Tx RF chain. The RF loss between a DAC and driver input was demonstrated to have been reduced by >1 decibel (dB) at 100 GHZ, which consequently reduced the amount of peaking and gain required from the driver and also improved the overall Tx SNR. Providing a high-speed optical package that leverages the continuous RF flexible printed circuit also removes the need for a standalone RF carrier in the CDM, which lowers bill of material (BOM) cost. It will be understood and appreciated that the same or similar benefits extend to embodiments in which the continuous RF flexible printed circuit is employed in ICRs or µICRs.

Figure 1B:
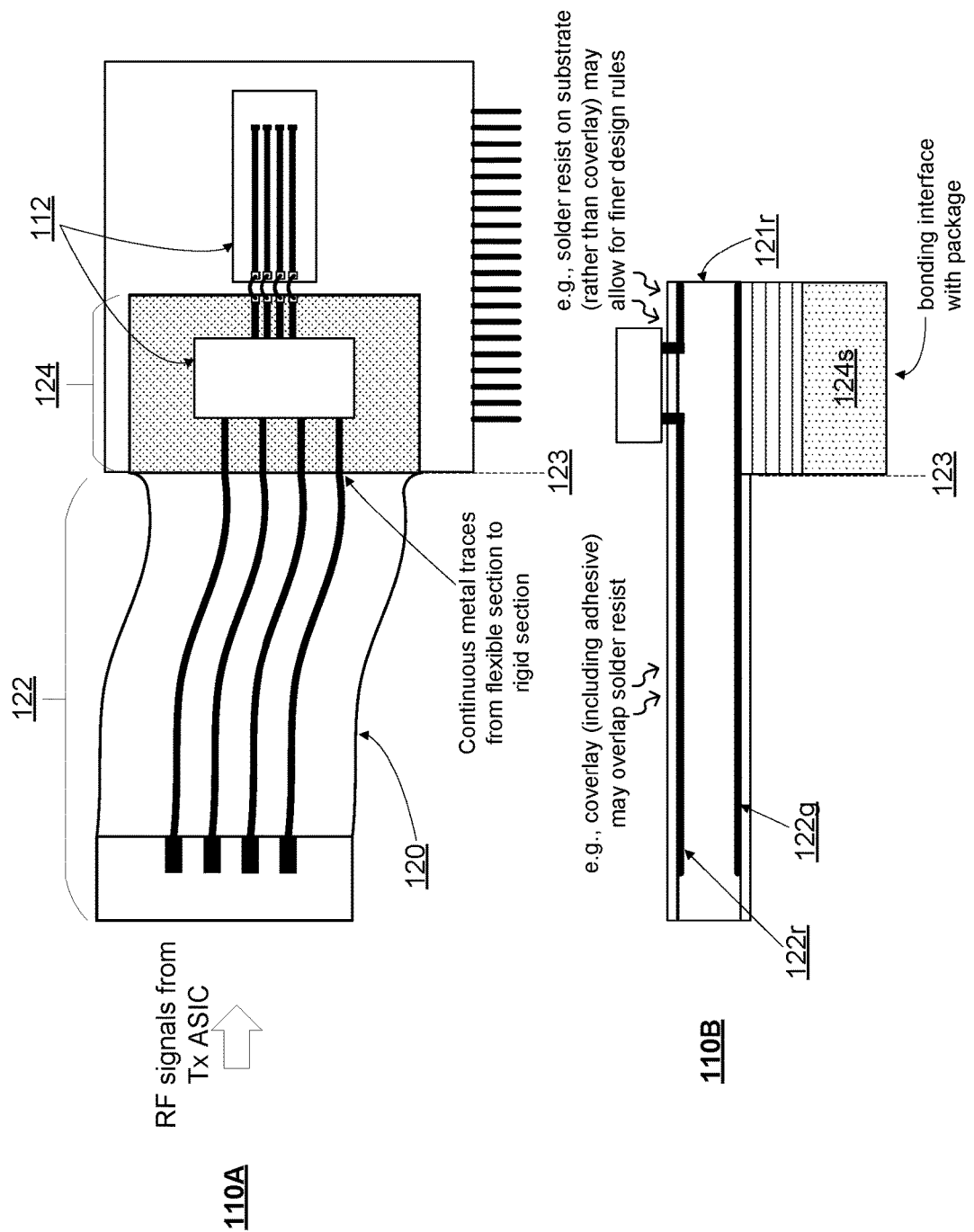
FIG. 1B shows various views of portion(s) of an example, non-limiting embodiment of a high-speed optical package that includes a continuous RF flexible printed circuit (FPC) that couples Tx ASIC outputs to a high-speed modulator interface, in accordance with various aspects described herein.
Figure 1C:
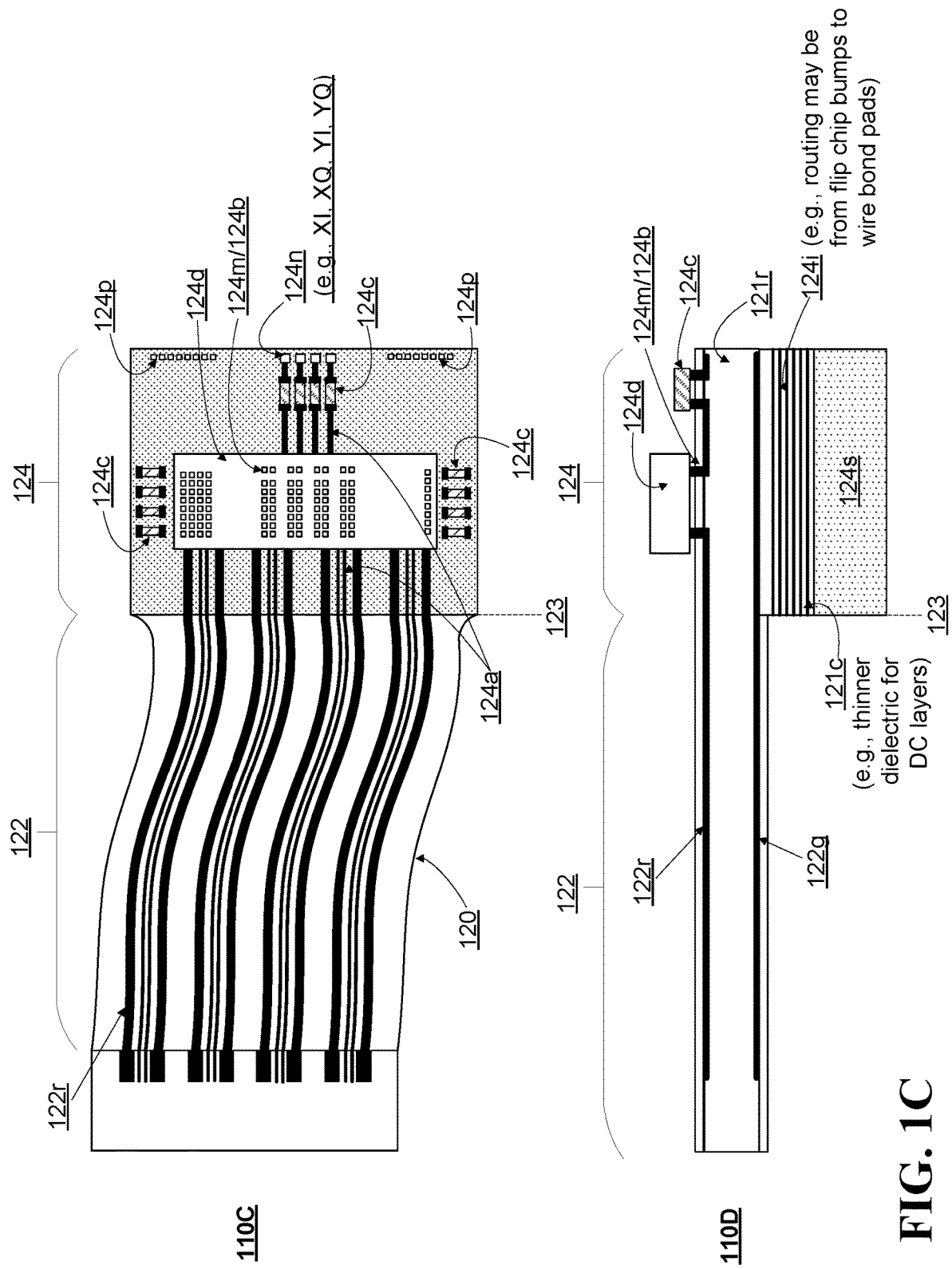
FIG. 1C shows various views of the FPC of FIG. 1B in accordance with various aspects described herein.

FIG. 1B shows various views 110A (top down view) and 110B (side view) of portion(s) of an example, non-limiting embodiment of a high-speed optical package 110 that includes a continuous RF FPC 120 that couples Tx ASIC outputs to a high-speed modulator interface, in accordance with various aspects described herein. FIG. 1C shows various views of the FPC 120 in accordance with various aspects described herein. In exemplary embodiments, the high-speed optical package 110 and the Tx ASIC may be included as part of an optical transmitter of a communication network. The optical transmitter may be in communication with at least one optical receiver. The optical transmitter may be capable of transmitting signals to the at least one optical receiver over an optical communication channel (e.g., one or more links, where each link may include one or more spans, and where each span may include a length of optical fiber and one or more optical amplifiers). In some embodiments, the optical transmitter may also be capable of receiving signals and/or the optical receiver(s) may also be capable of transmitting signals. Thus, the optical transmitter and/or the optical receiver(s) may each be capable of acting as a transceiver. In one or more embodiments, the optical transmitter and/or the optical receiver(s) may each be a coherent modem.

In exemplary embodiments, the high-speed optical package 110 may include a combination of optical and electrical components, such as, for example, a CDM 112 (which may include a driver and one or more modulators) and/or one or more other components of the optical transmitter, such as laser source(s), a modulator bias controller, a Tx controller, and/or the like. In various embodiments, the CDM 112 may employ nested Mach-Zehnder (MZ) architecture(s)—i.e., two dual-parallel MZs (DPMZs), each with two inner MZs and one outer MZ-resulting in a quad parallel MZ (QPMZ) modulator. In some embodiments, the CDM 112 may be a thin-film Lithium Niobate (TFLN)-based modulator. In other embodiments, the CDM 112 may be based on one or more other suitable materials/technologies.

In one or more embodiments, the optical transmitter may be equipped to control four quadrature data signals (i.e., radio frequency (RF) XI, RF XQ, RF YI, RF YQ signals, where X, Y denote polarization and I, Q denote in-phase and quadrature, respectively) via the Tx ASIC. For instance, the CDM 112 may include an XI modulator, an XQ modulator, and an outer phase modulator (respectively functioning as two inner MZs nested within an outer MZ for the X polarization) as well as a YI modulator, a YQ modulator, and an outer phase modulator (respectively functioning as two inner MZs nested within an outer MZ for the Y polarization). The laser source(s) may provide laser output(s) for modulation by the modulators of the CDM 112. A laser output may be divided (e.g., via a beam splitter) into X and Y polarizations, where the X polarization may be further divided (e.g., via another beam splitter) into an optical I input that is fed into an X-pol I-arm (i.e., the XI modulator) and an optical Q input that is fed into an X-pol Q-arm (i.e., the XQ modulator), and where the Y polarization may be further divided (e.g., via yet another beam splitter) into an optical I input that is fed into a Y-pol I-arm (i.e., the YI modulator) and an optical Q input that is fed into a Y-pol Q-arm (i.e., the YQ modulator). The CDM 112 may be capable of independently generating orthogonal optical electric field components (I channel and Q channel) for each polarization X and Y, according to various types of multi-value modulation methods, such as N-quadrature amplitude modulation (QAM), differential quadrature phase shift keying (D-QPSK), etc. In general operation, the Tx ASIC may receive a digital information stream at a digital input and convert the digital information stream (based on an associated modulation scheme) for driving the modulators of the CDM 112 via analog outputs (RF XI, RF XQ, RF YI, RF YQ). The analog outputs may be communicatively coupled to the modulator 112 via the FPC 120, as described in more detail below. In some embodiments, the Tx ASIC may include a digital filter that provides a transfer function H on the received digital input. DAC(s) may be connected to an output of the digital filter. Output(s) of the DAC(s) may be connected to the driver of the CDM 112 (which may include an analog amplifier and/or various other components) via the electrically conductive traces of the FPC 120 to provide a gain G. Output(s) of the driver may provide the analog output(s) to the modulators of the CDM 112. In certain embodiments, a controller may be connected to the digital filter and the driver to control the transfer function H and/or the gain G responsive to a data inversion control signal from a Tx controller.

As shown by reference number 110B of FIGS. 1B and 110D of FIG. 1C, the FPC 120 may be a multi-layer, semi-rigid flex substrate construction that includes a flexible section 122 and a rigid section 124. One or more portions of the FPC 120 may be composed of one or more materials (e.g., liquid crystal polymer or other composite material, such as Pyralux® TK or the like). The flexible section 122 may be at least partially composed of a thin, flexible structural support material 121r. In various embodiments, the flexible support material 121r may be a dielectric material. Example dielectric materials include polyester, polyimide, and/or the like. The circuit may be defined by placing or printing electrically conductive traces 122r (e.g., composed of copper or other suitable conductors) on the material and laminating the traces with one or more insulating layers, which can prevent the traces from shorting one another. Example insulating layer materials include polymer, such as epoxy, polyester, and/or the like. Laminating adhesive (e.g., a thermoset adhesive) may be used to bond the various materials together via high temperature curing.

As shown in FIGS. 1B and 1C, the flexible section 122 may include one or more reference ground (GND) traces 122g that are separated from the RF lines 122r by the flexible structural support material 121r. In one or more embodiments, a portion or an entirety of the rigid section 124 may be configured to be positioned within (or inserted into) the CDM package 112. As shown by reference number 110B of FIGS. 1B and 110D of FIG. 1C, the flexible support material 121r may span (e.g., in a continuous manner from the flexible section 122) a portion or an entirety of the rigid section 124. As also shown, electrically conductive traces 122r may span (e.g., in a continuous manner from the flexible section 122) over portions of the flexible support material 121r of the rigid section 124. However, rigid section 124 may include additional layer(s) that provide sufficient rigidity to support various circuit devices and/or components on the rigid section 124. For instance, the rigid section 124 may be configured to support a flip chip driver 124d (FIG. 1C) and/or one or more surface mount (SMT) active/passive components 124c. Active components may include transimpedance amplifier(s) (TIA(s)), a companion ASIC that provides assistive control for the driver, and/or the like. Passive components may include DC block(s) for AC-coupling of the driver outputs to the modulator, DC blocking or decoupling capacitor(s) for driver power lines, bias tec(s) for driver biasing, electrostatic discharge (ESD) diode(s), and/or the like.

As shown by reference number 110B of FIGS. 1B and 110D of FIG. 1C, the rigid section 124 may include a stiffener 124s. The stiffener 124s may be composed of any suitable material that provides sufficient stiffness for supporting the flip chip driver 124d and/or other components and that sufficiently flattens the rigid section 124 so that any metal landing pads thereon can properly interconnect with flip chip devices. Example materials of the stiffener 124s include flame retardant epoxy resin and glass fabric composite (FR4), aluminum nitride, and/or the like.

As shown by reference number 110D of FIG. 1C, the rigid section 124 may further include DC layers 124i between the ground traces 122g and the stiffener 124s. The DC layers 124i may facilitate provision of bias voltages that are necessary for operation of the CDM 112. As shown, the DC layers 124i may be separated by (e.g., thinner) dielectric layers 121c.

In exemplary embodiments, adapted RF routes 124a (i.e., transmission lines) may be formed from the electrically conductive traces 122r to one or more components/devices on the rigid section 124. As an example, some adapted RF routes 124a may be continuations of electrically conductive traces 122r that lead up to and couple to metal landing pads 124m (of the Flex substrate)/solder or (e.g., copper) pillar bumps 124b (of the driver). In some embodiments, the RF routes 124a may be high-speed RF transmission lines that are designed with specific properties of the rigid section 124 of the FPC 120 (e.g., particular dielectric constant(s), particular number(s) of metal layers of particular properties, conformance to minimum metal line and space layout rule(s)/constraint(s), conformance to via rule(s)/constraint(s), and/or the like). In certain embodiments, the high-speed RF transmission lines may have geometries that are determined by one or more of those specific properties. Trade-offs in spacing of these differential pairs may be made in order to meet channel density requirements. Continuing the example, adapted RF routes 124a may respectively interconnect analog output(s) 124n with metal landing pads 124m (of the Flex substrate)/solder or (e.g., copper) pillar bumps 124b (of the driver). As another example, some adapted RF routes 124a may be continuations of electrically conductive traces 122r that lead up to and couple to wire bond pads 124p on the rigid section 124. By adapting RF traces on or in the rigid section 124, transmission lines may be dedicated or reserved for high-speed routing without the use of or need for solder junctions.

Although not shown, in various embodiments, a thermal spreader may be positioned over the flip chip driver 124d. In some embodiments, a cap or lid may be positioned over the CDM 112 and the rigid section 124 (e.g., up until a boundary 123 between the flexible section 122 and the rigid section 124). In certain embodiments, the cap or lid may be composed of one or more materials that provide thermal spreading for the flip chip driver 124d. In these embodiments, the thermal spreader may or may not be included. In certain embodiments, the FPC 120 may additionally, or alternatively support a photonic die (i.e., modulator(s)). In these embodiments, the photonic die may be configured as a flip chip for direct positioning on the rigid section 124 (e.g., in a manner similar to the flip chip driver 124d). This can reduce a need for interconnections via actual wire bonding between the conductive traces 122r and the photonic die, which can further improve system performance. In some alternative embodiments, RF traces may additionally, or alternatively, traverse through one or more lower layers of the FPC 120, such as the stiffener 124s and/or one or more dielectric layers 121c. This can reduce or eliminate a need for wire bonds between the FPC and the photonic die.

In this way, the FPC 120 contrasts with conventional Flex cables in that the FPC 120 includes not only a cable portion, but also a substrate portion that allows for assembly of a variety of electronic components. An integrated CDM may thus be provided in which a continuous flexible printed circuit extends from the modem's ASIC to a high-speed modulator interface and can carry a flip chip driver and/or active/surface mount passives.

It will be understood and appreciated that embodiments of the FPC may be used for other applications. For instance, in one or more embodiments, the FPC may be used (or may be adapted for use) with optical receivers, such as ICRs or µICRs. In these embodiments, the flexible section of the FPC may be the same as or similar to that described above with respect to the CDM application (i.e., FIGS. 1B and 1C). However, the rigid section may be adapted to support certain device(s) of a µICR—e.g., an electronic integrated circuit (EIC) (which may include transimpedance amplifier(s) (TIA(s))), a photonic integrated circuit (PIC) (such as a silicon photonics (SiPhot) coherent receiver chip with high-speed photodiodes), or a combination thereof. Furthermore, the rigid section may also include RF routes (e.g., continuations of electrically conductive traces in/on the flexible section) that reach or communicatively couple to these device(s) and additional RF traces that communicatively couple these device(s) with one or more other components of the optical receiver. In some embodiments, thermal padding (e.g., thermal spreader(s) or the like) of the FPC for use with an ICR or µICR may be different from that used for a CDM.

Figure 2A:
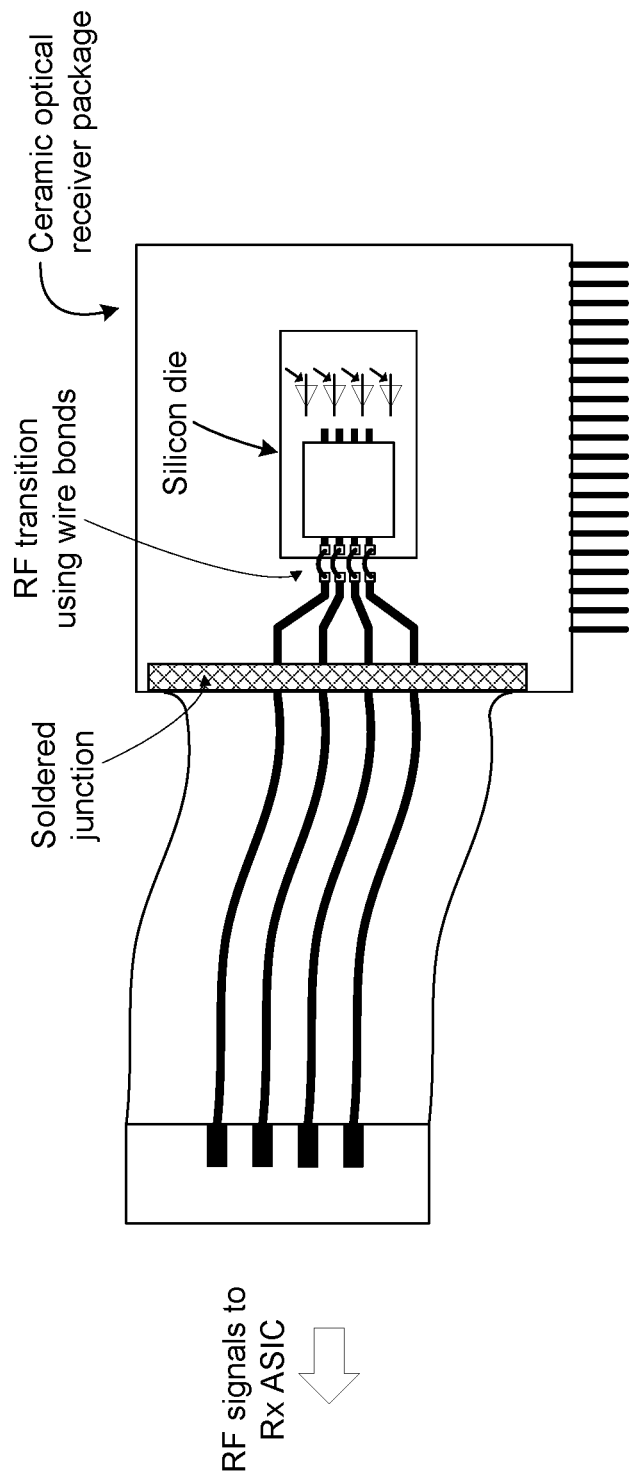
FIG. 2A illustrates an example attachment of a Flex to a ceramic package.
Figure 2B:
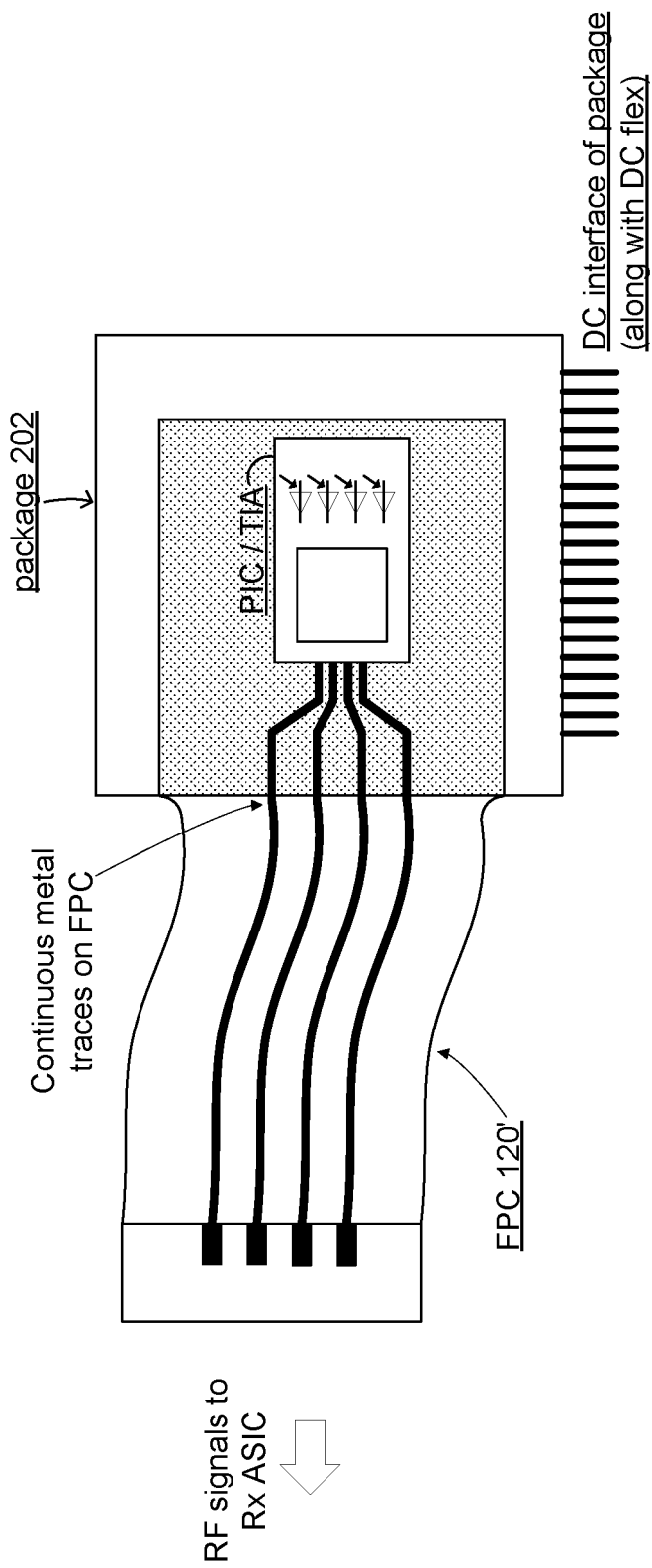
FIG. 2B illustrates an example, non-limiting embodiment of an integrated coherent receiver (ICR) in which a continuous flexible printed circuit extends from a photonic integrated circuit (PIC) (e.g., a photonic die's high-speed photodiodes) and/or an electronic integrated circuit (EIC) (e.g., transimpedance amplifiers (TIAs)) into/onto an ASIC of an optical receiver (Rx) (e.g., modem), in accordance with various aspects described herein.
Figure 2C:
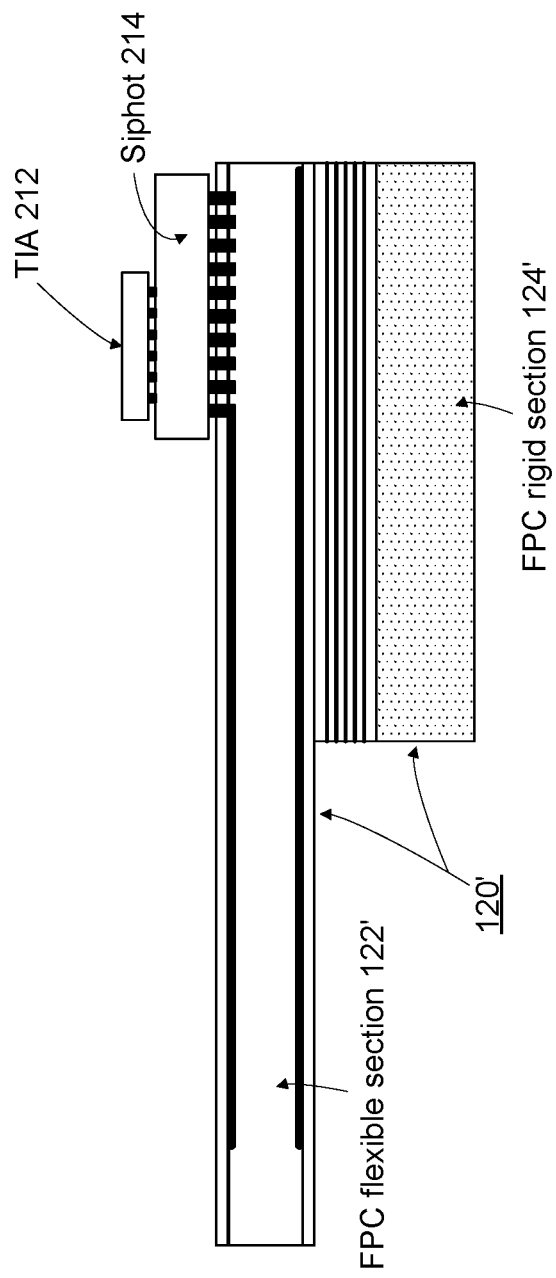
FIGS. 2C and 2D illustrate two example, non-limiting implementations of an FPC for an optical receiver on a substrate-like printed circuit board (PCB) (SLP), in accordance with various aspects described herein.
Figure 2D:
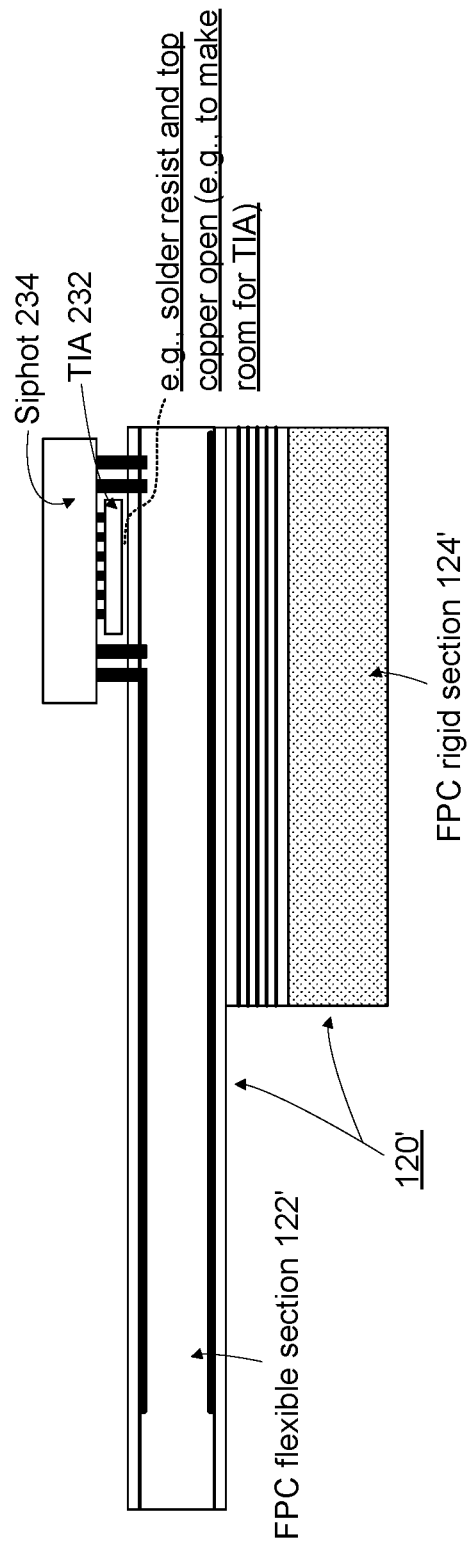

By employing such an FPC, no soldered junction may be necessary between the flexible printed circuit and the (e.g., ceramic) optical receiver package and no wire bonding may be necessary between the package and the silicon die. Compare FIG. 2A (which illustrates an example, conventional attachment of a Flex to a ceramic package) with FIG. 2B (which illustrates an example, non-limiting embodiment of an ICR in which a continuous flexible printed circuit 120' extends from a package 202's PIC (e.g., a photonic die's high-speed photodiodes) and/or EIC (e.g., TIAs) into/onto an ASIC of an optical receiver (e.g., modem), in accordance with various aspects described herein). FIGS. 2C and 2D illustrate two example, non-limiting implementations of the FPC 120' for an optical receiver on a substrate-like PCB (SLP), in accordance with various aspects described herein. As shown in FIG. 2C, in a first implementation, a TIA 212 and coherent receiver chip (Siphot 214) may be overlaid (e.g., in a stacked configuration) over a rigid section 124' of the FPC that extends from a flexible section 122' of the FPC. As shown in FIG. 2D, in another implementation, a coherent receiver chip (Siphot 234) and a TIA 232 may be overlaid (e.g., in a different stacked configuration) over the rigid section 124' of the FPC.

It is to be understood and appreciated that embodiments of the FPC described herein may be configured to interconnect devices that are compliant with one or more standards or agreements, such as Optical Internetworking Forum (OIF) implementation agreements or the like. It is also to be understood and appreciated that embodiments of the FPC may be configured to interconnect devices (e.g., CDMs, µICRs, etc.) that are packaged using any material, such as ceramic and/or other types of suitable materials.

It is further to be understood and appreciated that, although one or more of FIGS. 1B, 1C, 2B, 2C, and 2D might be described above as pertaining to various processes and/or actions that are performed in a particular order, some of these processes and/or actions may occur in different orders and/or concurrently with other processes and/or actions from what is depicted and described above. Moreover, not all of these processes and/or actions may be required to implement the systems and/or methods described herein. Furthermore, while various components have been illustrated in FIGS. 1B, 1C, 2B, 2C, and 2D as separate components, it will be appreciated that multiple components can be implemented as a single component, or a single component can be implemented as multiple components. Additionally, functions described as being performed by one component or system may be performed by multiple components or systems, or functions described as being performed by multiple components or systems may be performed by a single component or system.

Figure 3:
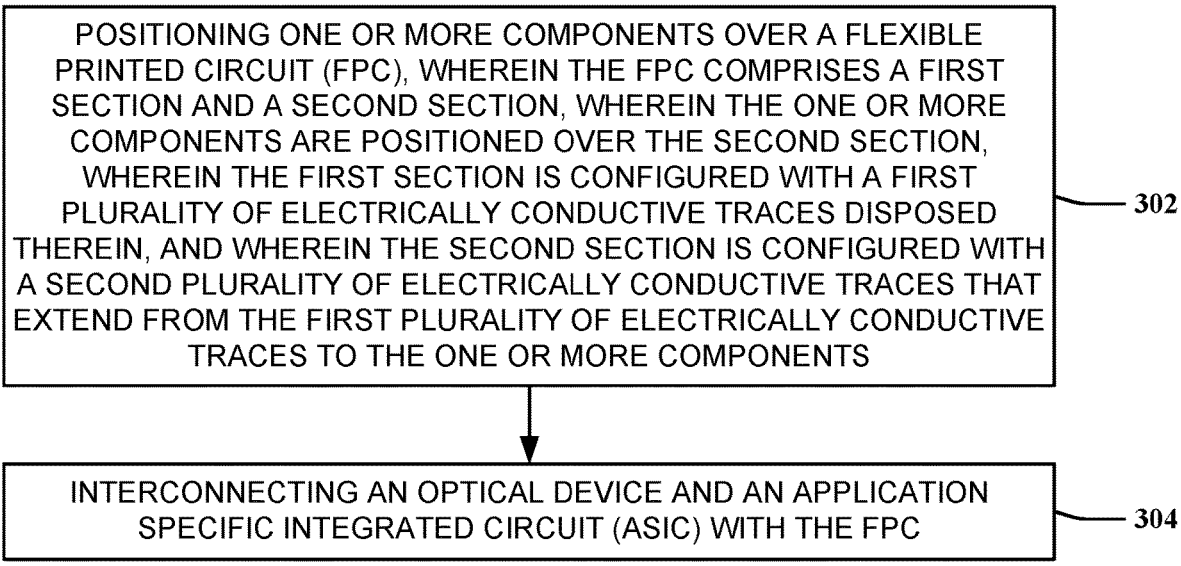
FIG. 3 depicts an illustrative embodiment of a method in accordance with various aspects described herein.

FIG. 3 depicts an illustrative embodiment of a method 300 in accordance with various aspects described herein.

At 302, the method can include positioning one or more components over a flexible printed circuit (FPC), wherein the FPC comprises a first section and a second section, wherein the one or more components are positioned over the second section, wherein the first section is configured with a first plurality of electrically conductive traces disposed therein, and wherein the second section is configured with a second plurality of electrically conductive traces that extend from the first plurality of electrically conductive traces to the one or more components.

At 304, the method can include interconnecting an optical device and an application specific integrated circuit (ASIC) with the FPC.

In some embodiments, the optical device comprises a coherent driver modulator (CDM), and the ASIC comprises a transmitter (Tx) ASIC.

In some embodiments, the optical device comprises a micro integrated coherent receiver (µICR) that includes a photonic integrated circuit (PIC) and an electronic integrated circuit (EIC) having one or more transimpedance amplifiers (TIAs), and the ASIC comprises a receiver (Rx) ASIC.

While for purposes of simplicity of explanation, the respective processes are shown and described as a series of blocks in FIG. 3, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

One or more aspects of the subject disclosure include a system, comprising an optical device, an application specific integrated circuit (ASIC), and a flexible printed circuit (FPC) for interconnecting the optical device and the ASIC, wherein the FPC includes a first section that is configured with a first plurality of electrically conductive traces, wherein the FPC further includes a second section over which one or more components are disposed, and wherein the second section is configured with a second plurality of electrically conductive traces that extend from the first plurality of electrically conductive traces to the one or more components.

One or more aspects of the subject disclosure include a flexible printed circuit (FPC) for interconnecting an optical device and an application specific integrated circuit (ASIC), wherein the FPC comprises a first section that is configured with a first plurality of electrically conductive traces and a second section over which one or more components are disposed, and wherein the second section is configured with a second plurality of electrically conductive traces that extend from the first plurality of electrically conductive traces to the one or more components.

One or more aspects of the subject disclosure include a method, comprising positioning one or more components over a flexible printed circuit (FPC), wherein the FPC comprises a first section and a second section, wherein the one or more components are positioned over the second section, wherein the first section is configured with a first plurality of electrically conductive traces disposed therein, and wherein the second section is configured with a second plurality of electrically conductive traces that extend from the first plurality of electrically conductive traces to the one or more components; and interconnecting an optical device and an application specific integrated circuit (ASIC) with the FPC.

In various embodiments, threshold(s) may be utilized as part of determining/identifying one or more actions to be taken or engaged. The threshold(s) may be adaptive based on an occurrence of one or more events or satisfaction of one or more conditions (or, analogously, in an absence of an occurrence of one or more events or in an absence of satisfaction of one or more conditions).

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, non-volatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments. Additionally, functions described as being performed by one component or system may be performed by multiple components or systems, or functions described as being performed by multiple components or systems may be performed by a single component or system, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A system, comprising:
   an optical device;
   an application specific integrated circuit (ASIC); and
   a flexible printed circuit (FPC) for interconnecting the optical device and the ASIC,
   wherein the FPC includes a first section that is configured with a first plurality of electrically conductive traces, wherein the FPC further includes a second section over which one or more components are disposed, and wherein the second section is configured with a second plurality of electrically conductive traces that extend from the first plurality of electrically conductive traces to the one or more components, the FPC having one or more ground traces and a dielectric support material that span at least a portion of the first section and at least a portion of the second section, the dielectric support material separating the one or more ground traces from the first and second pluralities of electrically conductive traces.

2. The system of claim 1, wherein the FPC, when employed as an interconnect between the ASIC and the optical device, decreases a number of solder junctions and/or wire bonds needed for radio frequency (RF) paths between the optical device and the ASIC or eliminates a need for solder junctions and/or wire bonds in RF paths between the optical device and the ASIC.

3. The system of claim 1, wherein the optical device comprises a coherent driver modulator (CDM), and wherein the ASIC comprises a transmitter (Tx) ASIC.

4. The system of claim 3, wherein the CDM comprises a driver, and wherein the one or more components include the driver, one or more active devices, one or more passive devices, or a combination thereof.

5. The system of claim 4, wherein the driver comprises a flip-chip driver.

6. The system of claim 3, wherein the CDM comprises a quad parallel Mach-Zehnder (QPMZ) modulator.

7. The system of claim 1, wherein the optical device comprises a micro integrated coherent receiver (μICR) that includes a photonic integrated circuit (PIC) and an electronic integrated circuit (EIC) having one or more transimpedance amplifiers (TIAs), and wherein the ASIC comprises a receiver (Rx) ASIC.

8. The system of claim 7, wherein the one or more components include the PIC, the EIC, one or more active devices, one or more passive devices, or a combination thereof.

9. The system of claim 1, wherein the first section has greater flexibility than the second section.

10. The system of claim 1, wherein the second section further comprises a stiffener that functions as a radio frequency (RF) carrier substrate.

11. The system of claim 10, wherein the stiffener is composed of a material that provides rigidity for supporting the one or more components.

12. The system of claim 11, wherein the material comprises flame retardant epoxy resin and glass fabric composite (FR4), aluminum nitride, or a combination thereof.

13. The system of claim 1, wherein the dielectric support material spans an entirety of the second section.

14. The system of claim 1, wherein the second section further comprises a plurality of direct current (DC) conductive lines that are separated by at least one dielectric layer.

15. A flexible printed circuit (FPC) for interconnecting an optical device and an application specific integrated circuit (ASIC), the FPC comprising:
 a first section that is configured with a first plurality of electrically conductive traces;
 a second section over which one or more components are disposed, wherein the second section is configured with a second plurality of electrically conductive traces that extend from the first plurality of electrically conductive traces to the one or more components; and
 one or more ground traces and a dielectric support material that span at least a portion of the first section and at least a portion of the second section, the dielectric support material separating the one or more ground traces from the first and second pluralities of electrically conductive traces.

16. The FPC of claim 15, wherein the optical device comprises a coherent driver modulator (CDM), and wherein the ASIC comprises a transmitter (Tx) ASIC.

17. The FPC of claim 15, wherein the optical device comprises a micro integrated coherent receiver (μICR) that includes a photonic integrated circuit (PIC) and an electronic integrated circuit (EIC) having one or more transimpedance amplifiers (TIAs), and wherein the ASIC comprises a receiver (Rx) ASIC.

18. A method, comprising:
 positioning one or more components over a flexible printed circuit (FPC),
  wherein the FPC comprises a first section and a second section,
  wherein the one or more components are positioned over the second section,
  wherein the first section is configured with a first plurality of electrically conductive traces disposed therein or thereon, and
  wherein the second section is configured with a second plurality of electrically conductive traces that extend from the first plurality of electrically conductive traces to the one or more components, the FPC having one or more ground traces and a dielectric support material that span at least a portion of the first section and at least a portion of the second section, the dielectric support material separating the one or more ground traces from the first and second pluralities of electrically conductive traces; and
 interconnecting an optical device and an application specific integrated circuit (ASIC) with the FPC.

19. The method of claim 18, wherein the optical device comprises a coherent driver modulator (CDM), and wherein the ASIC comprises a transmitter (Tx) ASIC.

20. The method of claim 18, wherein the optical device comprises a micro integrated coherent receiver (μICR) that includes a photonic integrated circuit (PIC) and an electronic integrated circuit (EIC) having one or more transimpedance amplifiers (TIAs), and wherein the ASIC comprises a receiver (Rx) ASIC.

* * * * *